(12) United States Patent
Park

(10) Patent No.: US 6,284,567 B1
(45) Date of Patent: Sep. 4, 2001

(54) MICROSENSOR, AND PACKAGING METHOD THEREFOR

(75) Inventor: Kyu-Yeon Park, Yongin-si (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 09/474,785

(22) Filed: Dec. 30, 1999

(30) Foreign Application Priority Data

Jun. 15, 1999 (KR) .................................................. 99-22227
Oct. 29, 1999 (KR) .................................................. 99-47402

(51) Int. Cl.[7] .................................................. H01L 21/44
(52) U.S. Cl. .......................... 438/107; 438/108; 438/112; 438/113
(58) Field of Search ..................................... 438/107, 108, 438/112, 113, 118, 119, 406, 533, 124

(56) References Cited

U.S. PATENT DOCUMENTS

| | | | |
|---|---|---|---|
| 5,408,731 | * | 4/1995 | Berggvist et al. ................... 29/25.41 |
| 5,834,334 | * | 11/1998 | Leedy ..................................... 438/107 |
| 5,908,719 | * | 6/1999 | Guckel et al. ............................. 430/5 |

FOREIGN PATENT DOCUMENTS

| | | | |
|---|---|---|---|
| 62268147-A | * | 11/1987 | (JP) ................................ H01L/23/34 |
| 07335920 | * | 12/1995 | (JP) . |
| 2000205862-A | * | 6/2000 | (JP) ................................ G01C/19/56 |

* cited by examiner

Primary Examiner—Charles Bowers
Assistant Examiner—Brook Kebede
(74) Attorney, Agent, or Firm—Lowe Hauptman Gilman & Berner, LLP

(57) ABSTRACT

A microsensor for use in a microgyroscope, and a packaging method therefor, are disclosed. During a bonding packaging operation for the purpose of protecting the microstructure or for the purpose of sealing it, the inside and outside of the packaged microsensor are perfectly connected together without a possibility of short circuit, so that any short circuit of the metal layer of the contact hole can be prevented. The method for packaging the microsensor includes the following steps. A structure installing part of a device wafer is etched so as to install a structure on a surface of the device wafer, and then, a sacrificial layer is formed on the part thus etched. A cavity is formed in a separate package wafer, and then, the package wafer (having a function of protection) is bonded onto a surface electrode of the device wafer thus manufactured. Then a contact hole is formed in the package wafer, for connecting the patterns of the device wafer and the package wafer together. Then a metal is deposited on the inside of the contact hole of the package wafer by applying a sputtering process.

10 Claims, 7 Drawing Sheets

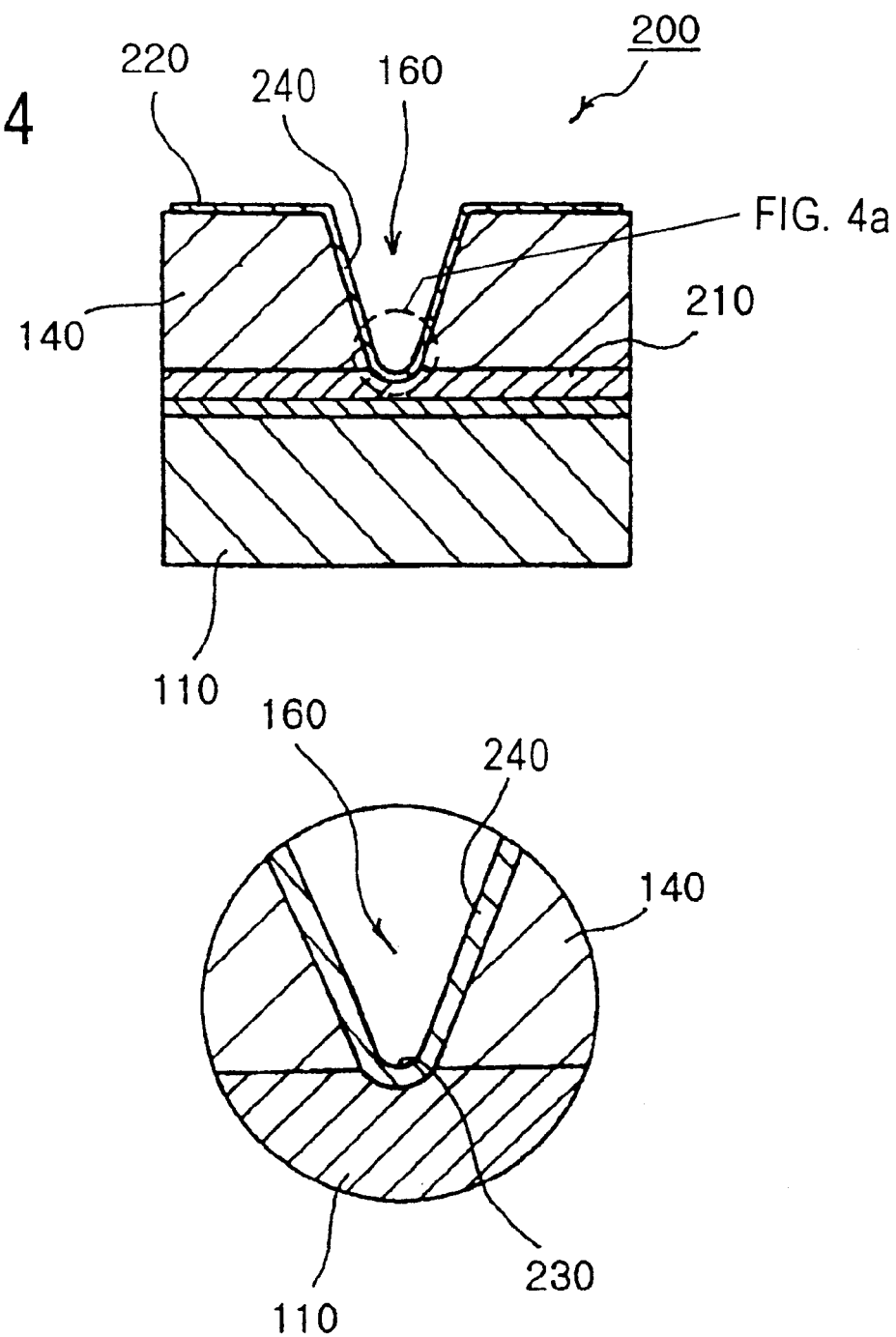

during the bonding process.

MICROSENSOR, AND PACKAGING METHOD THEREFOR

FIELD OF THE INVENTION

The present invention relates to a microsensor for use in a microgyroscope, and a packaging method therefor, in which during a bonding packaging operation for the purpose of protecting the microstructure or for the purpose of sealing it, the inside and outside of the packaged microsensor are perfectly connected together without a possibility of short circuit, so that any short circuit of the metal layer of the contact hole can be prevented. Further, the present invention relates to a method for packaging a microsensor, in which a metal deposition layer is continuously formed on the corner where the contact hole of the package wafer and the surface of the device wafer are contacted together, thereby preventing a short circuit of the metal layer of the contact hole.

BACKGROUND OF THE INVENTION

Generally, the conventional microsensor packaging method is carried out in the following manner.

That is, as shown in FIG. 1, on the surface of a device wafer 10 (FIG. 1a), an etching (20) is carried out at a certain thickness so as to install a structure (FIG. 1b). Then as shown in FIG. 1c, a sacrificial layer 30 is formed by carrying out an etching on the already etched part 20, thereby completing the device process. Then on the bottom of a separate package wafer 40 (FIG. 1d), an etching is carried out to form a cavity 50 (FIG. 1e). Then a through contact hole 60 is formed on the package wafer 40 as shown in FIG. 1f so as to make it contacted to the device wafer 10, thereby completing the package wafer process.

Then the protecting package wafer 40 is mounted on the surface of the device wafer 10 by carrying out a bonding step 50' as shown in FIG. 1g. Then in order to form patterns on the surface of the device wafer 10 and on the surface of the package wafer 40, and in order to connect them together, a metal deposition process 70 is carried out on the inside of the contact hole 60 of the package wafer 40 as shown in FIG. 1h, and then, a patterning is carried out, thereby completing the manufacture of the microsensor package.

However, the diameter of the contact hole 60 of the package wafer 40 has to be narrowed according as it is coming down, so that the deposited metal layer 70 would be perfectly continuous in the contact hole 60. Therefore, the lower portion of the contact hole 60 has to have a sharp corner, but the sharp corner is frequently detached during the manufacturing process or after the manufacture.

In the above described cases, when the metal layer 70 is deposited on the inside of the contact hole 60, the deposited metal is short-circuited to the surface of the device wafer 10, with the result that the device shows malfunctions, and thus the device becomes defective.

SUMMARY OF THE INVENTION

The present invention is intended to overcome the above described disadvantages of the conventional technique.

Therefore it is an object of the present invention to provide a microsensor in which the corner where the package wafer is connected to the device wafer is provided in the form of a round part, and thus a metal deposition layer is continuously formed at the corner, so that the short circuiting of the metal deposition layer of the contact hole can be prevented, and that the contact hole of the package wafer can be connected to the surface of the device wafer in a sure form.

It is another object of the present invention to provide a method for packaging a microsensor, in which a sand blast is carried out into the contact hole of the package wafer to improve the surface roughness so as to increase the adherence between the deposited metal layer and the package wafer, thereby preventing the peeling of the metal layer during the bonding process.

In achieving the above objects, the method for packaging a microsensor according to the present invention includes the steps of: etching a structure installing part of a device wafer so as to install a structure on a surface of the device wafer, and then, forming a sacrificial layer on the part thus etched (device manufacturing step); forming a cavity in a separate package wafer (package wafer manufacturing step); bonding the package wafer (having a function of protection) onto a surface electrode of the device wafer thus manufactured (wafer bonding step); forming a contact hole in the package wafer, for connecting patterns of the device wafer and the package wafer together (contact hole forming step); and depositing a metal on an inside of the contact hole of the package wafer by applying a sputtering process (metal depositing and patterning step).

In another aspect of the present invention, the microsensor according to the present invention includes: a device wafer with a surface electrode printed thereon; a package wafer bonded on the device wafer to protect the surface electrode of the device wafer; a contact hole formed in the package wafer to connect the surface electrode of the device wafer to a metal pattern of the surface of the package wafer; a round part formed on a corner where the contact hole of the package wafer is connected to the surface electrode of the device wafer; and a metal deposition layer deposited one the inside of the contact hole and on the surface of the package wafer, for a connection to the surface electrode of the device wafer.

BRIEF DESCRIPTION OF THE DRAWINGS

The above objects and other advantages of the present invention will become more apparent by describing in detail the preferred embodiment of the present invention with reference to the attached drawings in which:

FIG. 4 illustrates the coupling of the package wafer to the device wafer in the microsensor according to the present invention.

DETAILED DESCRIPTION OF THE PREFERRED EMBODIMENT

Figure 1A:
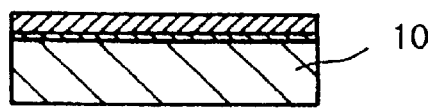
FIGS. 1a to 1h illustrate the general microsensor packaging method.
Figure 1B:
Figure 1C:
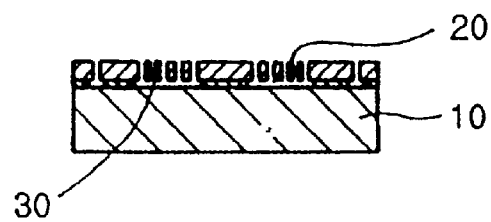
Figure 1D:
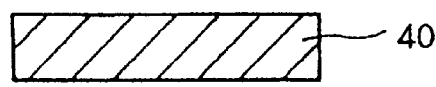
Figure 1E:
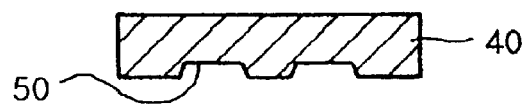
Figure 1F:
Figure 1G:
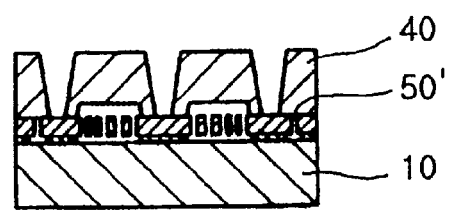
Figure 1H:
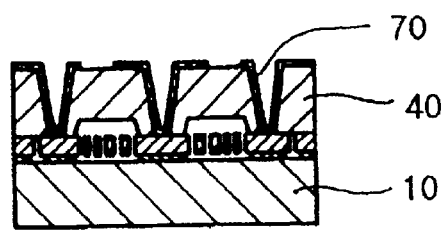
Figure 2:
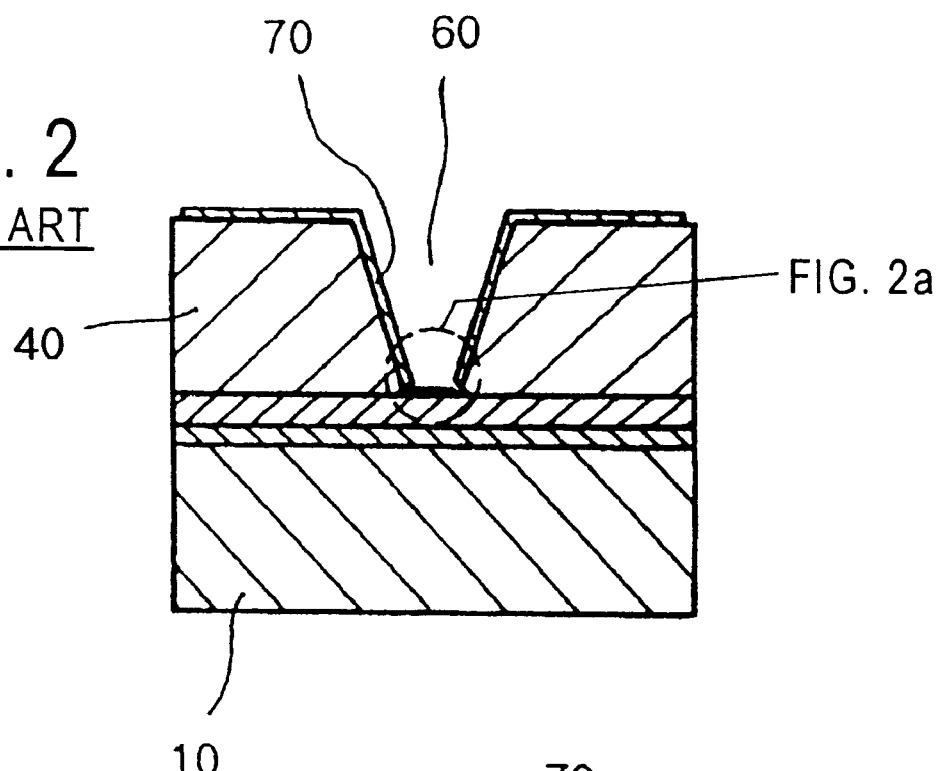
FIG. 2 illustrates in an enlarged scale the critical portion of the metal deposition layer deposited on the inside of the contact hole of the conventional microsensor package wafer.
Figure 2A:
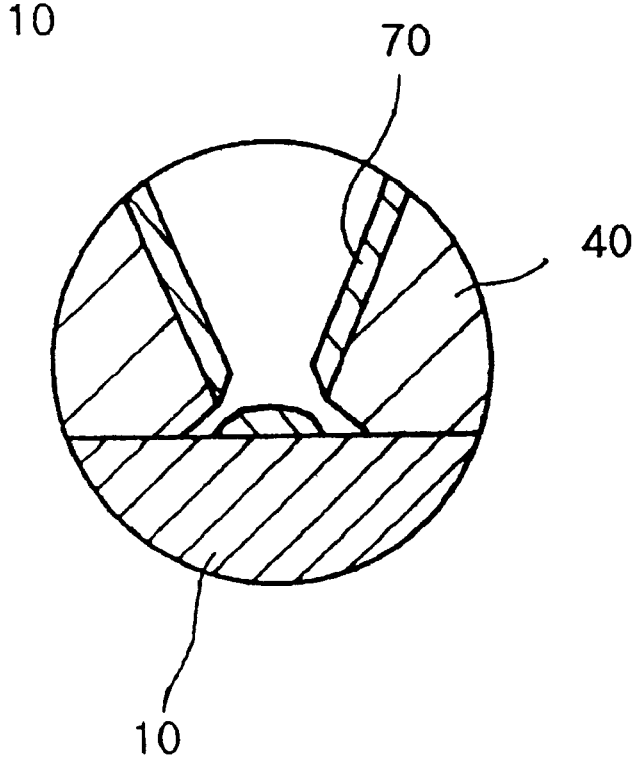

FIGS. 3a to 3h illustrate the microsensor packaging method according to the invention. FIG. 4 illustrates the coupling of the package wafer to the device wafer in the microsensor according to the present invention.

As shown in these drawings, a surface electrode 210 is printed upon a device wafer 110 in a certain thickness, and in order to protect the surface electrode 210 of the device wafer 110, a package wafer 140 is bonded on to the upper surface of the device wafer 110.

Further, a contact hole 160 is formed into the package wafer 140 to connect a metal electrode pattern 220 of the surface of the package wafer 140 to the device wafer 110. Further, a round part 230 is formed on the corner part where the contact hole 160 of the package wafer 140 is connected to the surface electrode 210 of the device wafer 110.

Then a metal layer is deposited on the inside of the contact hole 160 and on the surface of the package wafer 140, and thus, a metal deposition part 240 is formed to connect the electrode of the package wafer 140 to the surface electrode 210 of the device wafer 110.

Under this condition, the deposited metal of the metal deposition part 240 to be connected to the surface electrode 210 of the device wafer 110 may be Cr/Au or Ti/Au or aluminum (Al). Its thickness should be preferably 1000 Å-1 $\mu$m, and more preferably should be 2000–4000 Å.

Now the method for manufacturing the microsensor according to the present invention will be described.

FIGS. 3a to 3h illustrate the microsensor packaging method according to the present invention.

Figure 3A:
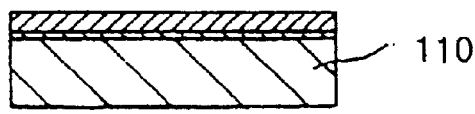
FIGS. 3a to 3h illustrate the microsensor packaging method according to the present invention.
Figure 3B:
Figure 3C:
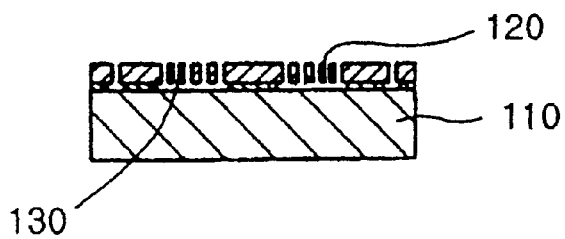

As shown in this drawing, in order that a lead of a structure should be installed on a device wafer 110 (FIG. 3a) which has been manufactured by a semiconductor process, the surface of the device wafer 110 is etched in a certain thickness as shown in FIG. 3b, thereby forming an etched layer 120 for installing the structure. An etched layer 120 is formed by etching the device wafer 110 as shown in FIG. 3c, and then, a sacrificial layer 130 is formed, the sacrificial layer 130 being composed of $SiO_2$. Under this condition, the thickness of the sacrificial layer should be preferably 2–3 $\mu$m, thereby completing a device process.

Figure 3D:
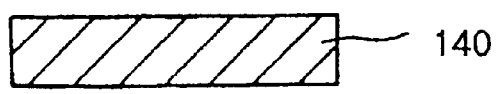
Figure 3E:
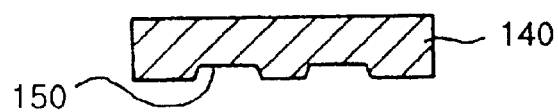
Figure 3F:
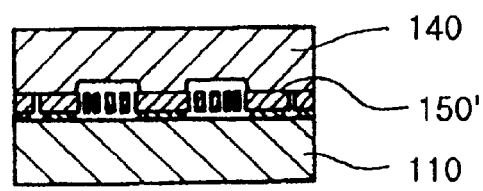

Then in order to manufacture a package wafer 140 for protecting the device wafer 110, the package wafer 140 in the form of a glass wafer is formed in a thickness of 500 $\mu$m as shown in FIG. 3d. Then a cavity 150 is formed by etching the bottom of the package wafer 140 (FIG. 3e). Then the package wafer 140 with the cavity 150 formed thereon is coupled to the device wafer 110 by matching the etched layer 120 of the device wafer 110 to the cavity 150 of the package wafer 140 as shown in FIG. 3f.

That is, the package wafer 140 is coupled to the surface electrode 210 of the device wafer 110 by applying a bonding process 150' so as to protect the latter.

Figure 3G:
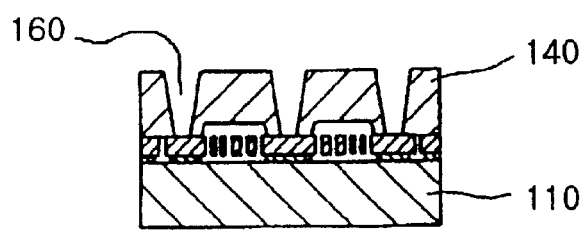

Then as shown in FIG. 3g, a through contact hole 160 is formed into the package wafer 140, so that a metal electrode pattern 220 of the package wafer 140 can be connected to the surface electrode 210 of the device wafer 110, thereby completing a packaging process.

Figure 5A:
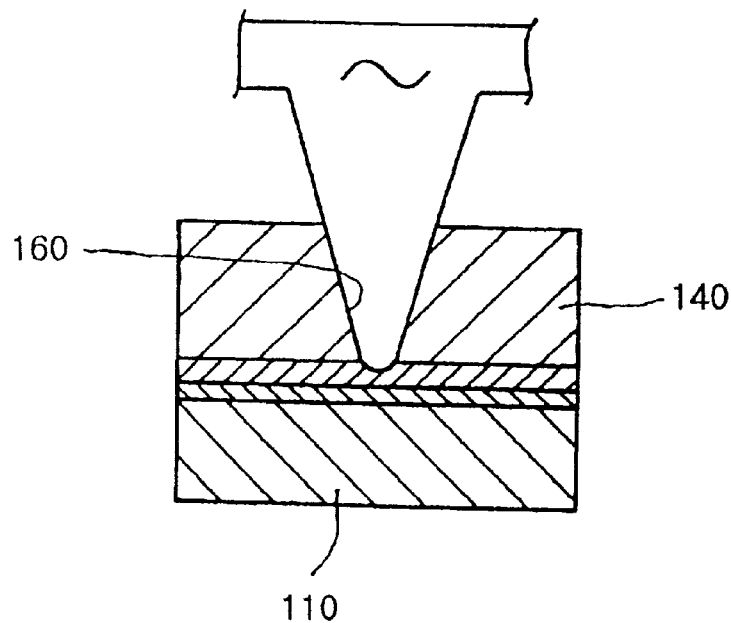
FIGS. 5A to 5B illustrate the method of forming the contact hole in the package wafer according to the present invention.
Figure 5B:
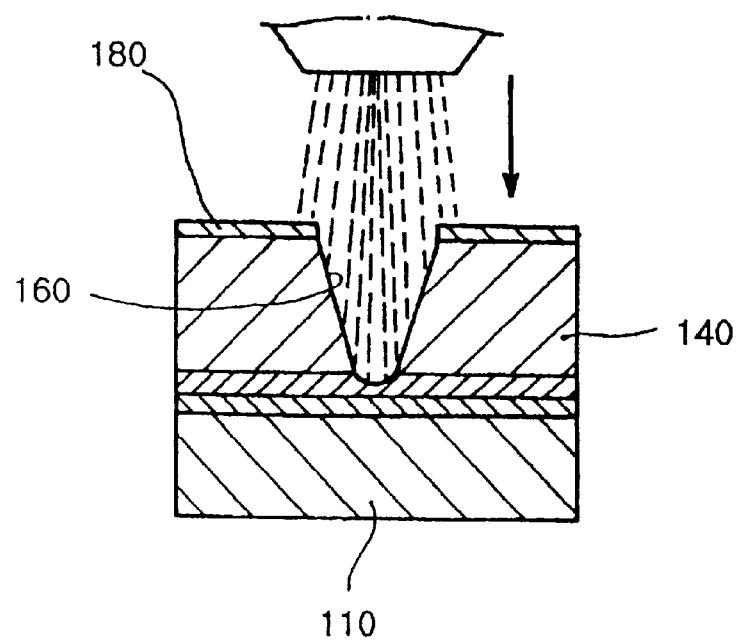

In forming the contact hole 160, as shown in FIG. 5a, a pin having a shape same as that of the contact hole 160 is oscillated by ultrasonic waves to drill the package wafer 140 so as to form the contact hole 160. Or as shown in FIG. 5b, a film 180 is attached on the surface of the package wafer, and a sand blast is carried out to form the contact hole 160. In this latter method, the sand particles are made to be collided onto the open portion of the film 180.

Figure 3H:
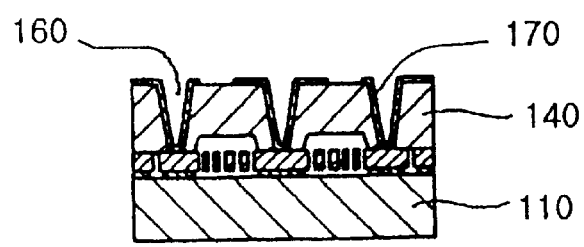

Meanwhile, the surface electrode 210 of the device wafer 110 has to be connected to the surface metal electrode pattern 220 of the package wafer 140. For this purpose, as shown in FIG. 3h, a conductive metal layer is deposited on the inside of the contact hole 160 of the package wafer 140. That is, a Cr/Au or Ti/Au or Al layer is deposited on the inside of the contact hole 160. The thickness of this metal layer should be preferably 1000 Å-1 $\mu$m, and more preferably should be 2000–4000 Å. Then a pattern is carried out, and thus, a smooth round part 230 is formed as shown in FIG. 4, so that the lower portion of the contact hole 160 would not be detached. Thus the metal deposition layer 240 shows a continuity at the round corner part where the surface electrode 210 of the device wafer 110 is contacted. Accordingly, an electric short circuit can be prevented.

According to the present invention as described above, the corner where the package wafer is connected to the device wafer is provided in the form of a round part, and thus a metal deposition layer is continuously formed at the corner, so that the short circuiting of the metal deposition layer of the contact hole can be prevented, and that the contact hole of the package wafer can be connected to the surface of the device wafer in a sure form. Further, a sand blast is carried out into the contact hole of the package wafer to improve the surface roughness so as to increase the adherence between the deposited metal layer and the package wafer, thereby preventing the peeling of the metal layer during the bonding process.

What is claimed is:

1. A method for packaging a microsensor, comprising the steps of:

etching a structure installing part of a device wafer so as to install a structure on a surface of said device wafer, and then, forming a sacrificial layer on said part thus etched;

forming a cavity in a separate package wafer;

bonding said package wafer onto a surface electrode of said device wafer thus manufactured;

forming a contact hole in said package wafer, for connecting patterns of said device wafer and said package wafer together; and depositing a metal on an inside of said contact hole of said package wafer by applying a sputtering process, wherein a round part is formed on a lower portion of said contact hole of said package wafer, and thus, a metal deposition layer forms a continuity at said round part where said metal deposition layer contacts to said surface electrode of said device wafer.

2. The method as claimed in claim 1, wherein said metal deposition layer deposited on the inside of said contact hole to connect said patterns of said package wafer to said surface electrode of said device wafer is composed of Cr/Au.

3. The method as claimed in claim 1, wherein said metal deposition layer deposited on the inside of said contact hole to connect said patterns of said package wafer to said surface electrode of said device wafer is composed of Ti/Au.

4. The method as claimed in claim 1, wherein said metal deposition layer deposited on the inside of said contact hole to connect said patterns of said package wafer to said surface electrode of said device wafer is composed of Al.

5. The method as claimed in claim 1, wherein said metal deposition layer deposited on the inside of said contact hole to connect said patterns of said package wafer to said surface electrode of said device wafer has a thickness of 1000 Å-1 $\mu$m.

6. The method as claimed in claim 1, wherein said metal deposition layer deposited on the inside of said contact hole to connect said patterns of said package wafer to said surface electrode of said device wafer has a thickness of 2000–4000 Å.

7. The method as claimed in claim 1, wherein said package wafer installed upon said device wafer is a glass wafer.

8. The method as claimed in claim 1, wherein said package wafer installed upon said device wafer has a thickness of 500 $\mu$m.

9. The method as claimed in claim 1, wherein said sacrificial layer formed on a bottom of an etched portion of said device wafer is composed of $SiO_2$.

10. The method as claimed in claim 1, wherein said sacrificial layer formed on the bottom of said etched portion of said device wafer has a thickness of 2–3 $\mu$m.

* * * * *